(12) United States Patent
Fujiwara et al.

(10) Patent No.: US 8,624,594 B2
(45) Date of Patent: Jan. 7, 2014

(54) POLARIZED XENON GAS CONCENTRATION METHOD, POLARIZED XENON GAS MANUFACTURING SUPPLY DEVICE, AND MRI SYSTEM

(75) Inventors: Hideaki Fujiwara, Suita (JP); Hirohiko Imai, Suita (JP); Satoshi Iguchi, Suita (JP); Hironobu Yoshimura, Suita (JP); Atsuomi Kimura, Suita (JP)

(73) Assignee: Osaka University, Osaka (JP)

( * ) Notice: Subject to any disclaimer, the term of this patent is extended or adjusted under 35 U.S.C. 154(b) by 397 days.

(21) Appl. No.: 13/055,246

(22) PCT Filed: Jul. 29, 2009

(86) PCT No.: PCT/JP2009/063482
§ 371 (c)(1),
(2), (4) Date: Jan. 21, 2011

(87) PCT Pub. No.: WO2010/013743
PCT Pub. Date: Feb. 4, 2010

(65) Prior Publication Data
US 2011/0128002 A1    Jun. 2, 2011

(30) Foreign Application Priority Data
Aug. 1, 2008  (JP) ................................ 2008-199302

(51) Int. Cl.
*G01V 3/00*  (2006.01)
(52) U.S. Cl.
USPC ........................................... 324/307; 62/637
(58) Field of Classification Search
USPC ............................. 324/307, 309, 321; 62/637
See application file for complete search history.

(56) References Cited

U.S. PATENT DOCUMENTS 5,617,860 A  *  4/1997  Chupp et al. .................. 600/420
5,642,625 A     7/1997  Cates, Jr. et al.
(Continued)

FOREIGN PATENT DOCUMENTS

| JP | 2-56934 | 12/1990 |
|----|---------|---------|
| JP | 9-229551 | 9/1997 |

(Continued)

OTHER PUBLICATIONS

Supplementary European Search Report dated Jul. 22, 2011 issued in connection with European Application corresponding to present U.S. Application.

(Continued)

*Primary Examiner* — Louis Arana
(74) *Attorney, Agent, or Firm* — Wenderoth, Lind & Ponack, L.L.P.

(57) ABSTRACT

The present invention relates to a polarized xenon gas manufacturing supply device that is provided with a polarization cell 6 that produces a polarized xenon gas by polarizing a mixture of xenon gas and a diluent gas that consists primarily of a high-boiling-point gas that has a boiling point higher than that of the xenon gas, and a condenser (9) that cools the mixed gas discharged from the polarization cell (6) and condenses and separates the high-boiling-point gas by using the difference in boiling points between the xenon gas and the high-boiling-point gas, wherein the supply device is constructed so as to re-vaporize the condensed liquid of the high-boiling-point gas produced by the condenser (9) and introduce it to the polarization cell (6). This polarized xenon gas manufacturing supply device makes it possible to continuously manufacture and supply highly polarized and highly concentrated xenon gas.

10 Claims, 7 Drawing Sheets

(56) References Cited

U.S. PATENT DOCUMENTS

| | | | |
|---|---|---|---|
| 5,860,295 A * | 1/1999 | Cates et al. | 62/637 |
| 5,934,103 A | 8/1999 | Ryan et al. | |
| 6,079,213 A | 6/2000 | Driehuys et al. | |
| 6,199,385 B1 | 3/2001 | Driehuys et al. | |
| 6,305,190 B1 | 10/2001 | Driehuys et al. | |
| 6,667,008 B2 * | 12/2003 | Zollinger et al. | 422/83 |
| 7,373,782 B2 | 5/2008 | Driehuys et al. | |
| 2002/0035836 A1 | 3/2002 | Driehuys et al. | |
| 2004/0211191 A1 | 10/2004 | Driehuys et al. | |
| 2006/0083789 A1 | 4/2006 | Ohtake et al. | |
| 2007/0156046 A1 | 7/2007 | Hasing et al. | |

FOREIGN PATENT DOCUMENTS

| | | |
|---|---|---|
| JP | 2000-88455 | 3/2000 |
| JP | 2002-500337 | 1/2002 |
| JP | 2004-262668 | 9/2004 |
| JP | 2005-21829 | 1/2005 |
| JP | 2008-55157 | 3/2008 |
| JP | 2008-216136 | 9/2008 |

OTHER PUBLICATIONS

International Search Report issued Nov. 2, 2009 in International (PCT) Application No. PCT/JP2009/063482.

Junko Fukutomi et al., "Analysis of the Effect of Foreign Gases in the Production of Hyperpolarized $^{129}$Xe Gas on a Simple System Working under Atmospheric Pressure," Journal of Magnetic Resonance, vol. 160, pp. 26-32, 2003.

Tetsuya Wakayama et al., "Hyperpolarized $^{129}$Xe MRI of the Mouse Lung at a Low Xenon Concentration Using a Continuous Flow-Type Hyperpolarizing System," Journal of Magnetic Resonance Imaging, vol. 27, pp. 777-784, 2008.

* cited by examiner (a)

(b)

POLARIZED XENON GAS CONCENTRATION METHOD, POLARIZED XENON GAS MANUFACTURING SUPPLY DEVICE, AND MRI SYSTEM

TECHNICAL FIELD

The present invention relates to a polarized xenon gas concentration method, a polarized xenon gas manufacturing supply device, and an MRI system.

BACKGROUND ART

A polarized xenon gas can be produced by, for example, an optical-pumping method that uses rubidium or a like alkali metal. The polarized xenon gas is suitably used for NMR (nuclear magnetic resonance) devices, MRI (magnetic resonance imaging) devices and the like. In order to obtain a highly polarized xenon gas, a diluent gas composed of nitrogen, helium or like inert gas is usually added to a xenon gas during its production process. By separating the resulting polarized xenon gas from the diluent gas and concentrating it, a highly concentrated polarized xenon gas can be obtained.

Using liquid nitrogen to solidify a polarized xenon gas has been proposed as a method for concentrating the polarized xenon gas by separation of a diluent gas. However, this method has a drawback in that the polarization rate decreases in the process of solidifying and volatilizing the xenon. Furthermore, in this method, the xenon gas has to be once solidified and removed. This makes the continuous production of polarized xenon gas impossible; therefore, its use is limited to NMR or MRI experiments conducted in a batch mode. More specifically, the increase in the polarization rate by mixing a diluent gas becomes remarkable when the concentration of xenon gas is as low as 10% or less (Non-patent Literature 1). But the separation of a large amount of diluent gas, i.e., more than 10 times the amount of the xenon, becomes necessary since a high polarization rate is obtained under a high dilution condition. But, solidifying xenon is an only effective method to realize the separation under such a condition. Therefore, measurement in NMR or MRI has been conducted only in a batch mode.

In contrast, a continuous supply of a concentrated xenon gas with a high polarization rate is necessary to conduct on-line measurement in NMR or MRI. Patent Literature 1 discloses a device that uses a selectively permeable membrane which transmits a diluent gas only and does not transmit polarized xenon gas so that the polarized xenon gas, which does not pass through the membrane, is extracted by suction. However, although the device disclosed in Patent Literature 1 succeeded in obtaining a higher concentration of polarized gas by transmitting only the diluent gas and the polarized gas is concentrated to approximately twofold in xenon concentration, the polarization rate of xenon gas is reduced to ½. Therefore, a reduction in the polarization rate is serious and the total sensitivity (polarization rate×concentration) is not improved as a whole.

Patent Literature 2 discloses that highly concentrated xenon gas can be obtained without the solidification of polarized xenon by using a high concentration xenon gas such as 80 to 100% in xenon (the remaining portion is nitrogen gas) as a source gas to be hyperpolarized; however, the polarization rate is as low as 1 to 2% (estimated from the data disclosed in Non-patent Literature 2).

CITATION LIST

Patent Literature

PTL 1: Japanese Unexamined Patent Publication No. 2005-21829
PTL 2: Japanese Unexamined Patent Publication No. 2004-262668

Non-Patent Literature

NPL 1: J. Fukutomi, E. Suzuki, T. Shimizu, A. Kimura, and H. Fujiwara, J. Magn. Reson., 160, 26 (2003)

SUMMARY OF INVENTION

Technical Problem

An object of the present invention is to provide a polarized xenon gas concentration method that is capable of concentrating xenon gas having a high polarization rate at a high concentration.

Another object of the present invention is to provide a polarized xenon gas manufacturing supply device that is capable of continuously manufacturing and supplying a highly polarized and highly concentrated xenon gas.

Still another object of the present invention is to provide an MRI system that is capable of continuously performing MRI measurement with high sensitivity.

Solution to Problem

The object of the present invention is achieved by a method for concentrating polarized xenon gas that comprises the steps of obtaining a polarized xenon gas by polarizing a mixed gas of xenon gas and a diluent gas, and separating the diluent gas from the polarized xenon gas to concentrate the polarized xenon gas. In this method, the diluent gas comprises, as a main component, a high-boiling-point gas in which the boiling point is higher than that of xenon gas, and the high-boiling-point gas is concentrated and separated by using the difference in the boiling point between the xenon gas and the high-boiling-point gas.

The above object of the present invention is also achieved by a polarized xenon gas manufacturing supply device that comprises a polarization cell for producing polarized xenon gas by polarizing a mixed gas of xenon gas and a diluent gas comprising, as a main component, a high-boiling-point gas in which the boiling point is higher than that of xenon gas; and a condenser for cooling the mixed gas discharged from the polarization cell and condensing and separating the high-boiling-point gas by using the difference in the boiling points between xenon gas and the high-boiling-point gas. The polarized xenon gas manufacturing supply device is structured so that the condensed liquid of high-boiling-point gas produced by the condenser is re-vaporized and introduced to the polarization cell.

The object of the present invention is further achieved by an MRI system that is provided with the aforementioned polarized xenon gas manufacturing supply device and that performs MRI measurement using the produced polarized xenon gas.

Advantageous Effects of Invention

The polarized xenon gas concentration method of the present invention is capable of concentrating xenon gas having a high polarization rate at a high concentration.

The polarized xenon gas manufacturing supply device of the present invention can continuously supply xenon gas with a high polarization rate at a high concentration.

The MRI system of the present invention allows MRI measurement to be performed continuously with high sensitivity.

DESCRIPTION OF EMBODIMENTS

Figure 1:
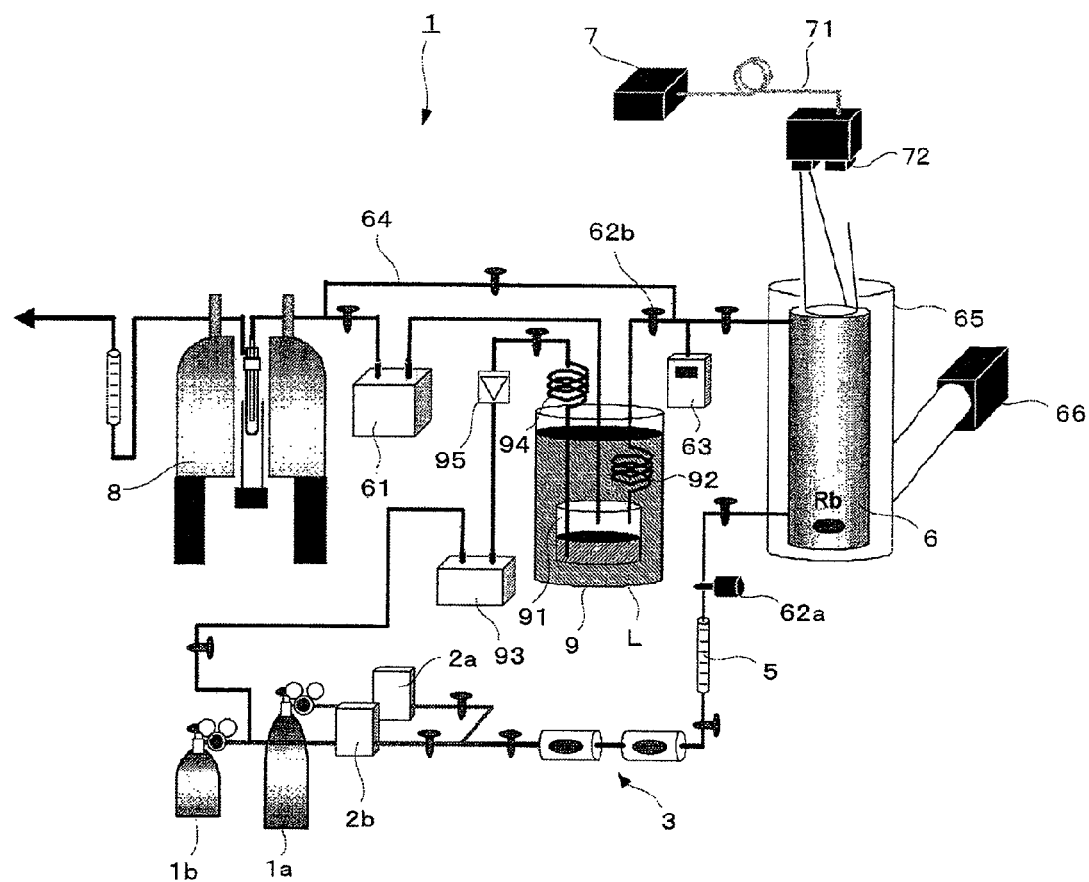
FIG. 1 is a schematic diagram illustrating the polarized xenon gas manufacturing supply device of the present invention.

One embodiment of the present invention is explained below with reference to the attached drawings. FIG. 1 is a schematic diagram illustrating the polarized xenon gas manufacturing supply device of the present invention. The polarized xenon gas manufacturing supply device 1 is provided with a polarization cell 6 that produces a polarized xenon gas by polarizing a mixed gas of polarized xenon gas and a diluent gas, and a condenser 9 that separates the diluent gas from the resulting polarized xenon mixed gas.

The polarization cell 6 is connected to supply sources 1a, 1b composed of a gas cylinder or the like. The supply sources 1a, 1b, respectively, store xenon gas and a diluent gas. The xenon gas stored in the supply source la contains xenon isotopes ($^{129}$Xe) having an atomic mass number of 129. Examples of usable xenon gases include natural xenon gas (natural abundance of 26.4%), highly concentrated $^{129}$Xe gas having an isotope abundance ratio of as high as approximately 90%, and the like.

The diluent gas stored in the supply source 1b achieves a quenching effect that suppresses the process of the electron spin, which was photoexcited by polarization in the polarization cell 6, returning to the ground state while emitting electromagnetic waves. It is preferable that for the reduction of the depolarization effect, a buffering effect be achieved by avoiding the frequent collision of the polarized spin with the cell walls. Here, the diluent gas should comprise a gas having a boiling point higher than that of xenon gas. In order to enhance the separation effect from the polarized xenon gas, a gas having a large difference in the boiling points is preferable. Furthermore, the gas preferably has low chemical reactivity because it comes in contact with rubidium or a like alkali metal during the polarization process.

A high-boiling-point gas that has a boiling point higher than that of xenon gas, and that achieves the aforementioned quenching effect is preferably used as the diluent gas. Specifically unsaturated hydrocarbons and/or ether compounds that comprise multiple bonds can be effectively used. The present inventors tested various materials and found that isobutene ($CH_3C(CH_3)=CH_2$, boiling point at ordinary pressure: $-6.9°$ C.) is effectively usable as a diluent gas having such properties. Isobutene gas can be readily separated from xenon gas (boiling point at ordinary pressure: $-108°$ C.) because it has a boiling point greatly different from that of xenon gas. According to experiments conducted by the present inventors, isobutene gas achieves the same degree of quenching effect as nitrogen gas, which is commonly used as a diluent gas. Also, as shown in the Examples described below, in addition to isobutene, propene, 2-methyl-2-butene, and furan can be desirably used as a high-boiling-point gas.

As long as a certain amount of quenching gas, such as nitrogen or isobutene, that achieves the quenching effect is contained, butane ($C_4H_{10}$, boiling point: $-0.5°$ C., melting point: $-138°$ C.), 2-methylpropane ($C_4H_{10}$, boiling point: $-12°$ C., melting point: $-160°$ C.), propane ($C_3H_8$, boiling point: $-42.1°$ C., melting point: $-188°$ C.), pentane ($C_5H_{12}$, boiling point: 35 to 36° C., melting point: $-130°$ C.), 2-methylbutane ($C_5H_{12}$, boiling point: 30° C., melting point: $-160°$ C.) and like compounds having a boiling point higher than that of Xe may be added as a high-boiling-point gas. This can increase the number of gases that are potentially usable as a high-boiling-point gas. These high-boiling-point gases, which are saturated hydrocarbon compounds, do not exhibit a quenching effect, but have a buffering effect. In this case, the high-boiling-point gas is in a gaseous or liquid form at ordinary temperatures. If the high-boiling-point gas is in a liquid form, it is preferable that the high-boiling-point gas have a vapor pressure of approximately 0.3 atm or higher at ordinary temperatures, and that the high-boiling-point gas can apply a pressure higher than the operating pressure of a polarization cell even when the operating differential pressure of the mass flow controller or like gas supply unit (usually, approximately 0.2 atm) is subtracted. When a compound having a vapor pressure that does not reach approximately 0.3 atm at ordinary temperatures is used, a suction pump or the like can be connected to the outlet of the mass flow controller or like gas supply unit so that the preferable vapor pressure is reduced to approximately the level of the partial pressure of the compound within the polarized gas.

The high-boiling-point gases may be ether compounds (dimethylether, $C_2H_6O$, boiling point: 24.8° C., melting point: $-141°$ C.; diethylether, $C_4H_{10}$, boiling point: 35 to 36° C., melting point: $-116°$ C.; etc.), or derivatives of saturated hydrocarbons such as halogen-substituted compounds (1,1-difluoroethane, $C_2H_4F_2$, boiling point: $-25°$ C., melting point: $-117°$ C.; etc.). Also in this case, the high-boiling-point gas is in a gaseous or liquid form at ordinary temperatures. If the high-boiling-point gas is in a liquid form, it is preferable that the high-boiling-point gas have a vapor pressure of approximately 0.3 atm or higher at ordinary temperatures, and that the high-boiling-point gas can apply a pressure higher than the operating pressure of a polarization cell even when the operating differential pressure of the mass flow controller or like gas supply unit (generally, approximately 0.2 to 0.3 atm) is subtracted.

A gas having a quenching effect will sufficiently exhibit said effect if at least a certain amount of it is contained; therefore, an inert gas which is easy to handle can be mixed with a quenching gas having a certain partial pressure depending on the application conditions (condensation temperature, pressure, etc.). The use of a gas in which hydrogen is substituted by deuterium, such as butane-$d_{10}$, is effective for improving the SNR of a polarized gas, since it can reduce the influence of magnetic dipoles although the cost is increased for the material gas. When butane gas or a like saturated hydrocarbon compound is added, the gas pressure during polarization (i.e., the polarization cell operating pressure) may increase corresponding to the amount of saturated hydrocarbon added; however, it is preferable that the pressure be controlled, after trapping, at the pressure just before adding the saturated hydrocarbon by a pressure control valve attached between the polarization cell and a trap.

As described above, as long as the diluent gas comprises a high-boiling-point gas as a main component (50% by volume or more), it can contain other components in order to desirably maintain the quenching effect or buffering effect.

When the diluent gas comprises protons, because the protons promote Xe depolarization, it is preferable, although not required, that the protons be substituted with deuteriums. Furthermore, acetylene and like sublimable compounds solidify from gas when they are cooled; therefore, a means is necessary to recover such compounds after the separation by cooling. Among unsaturated hydrocarbons, ethylene ($CH_2=CH_2$, boiling point at ordinary pressure: $-103.7°$ C.) exhibits almost the same quenching effect as nitrogen. However, its boiling point differs from that of Xe only slightly, and hence it requires strict temperature control in the condenser 9 to be described later.

The gas stored in the supply source 1b is not limited to a singular kind. A plurality of gases may be mixed on site, or in advance.

The xenon gas and the diluent gas supplied from the sources 1a,1b pass through mass flow controllers 2a,2b, respectively, so that their flow rates are controlled and they are mixed in such a manner that the resulting mixture has a predetermined composition ratio. The resulting mixed gas is then supplied to a drying unit 3.

Examples of the structures of the drying unit 3 include one in which a liquid desiccating agent composed of an alloy of metallic potassium (K) and metallic sodium (Na) is contained in glass containers and such multiple glass containers are arranged in layers, or one in which multiple gas purification vessels (for example, "Mini Fine Purer" manufactured by Liquid Gas Co., Ltd.) containing an adsorbent are connected. When a K—Na alloy is used, it is preferable that stirring be conducted in the glass container by using a stirrer or the like. This not only enhances the drying effect but also prevents side effects attributable to the degradation of the desiccating agent (degradation of the alkali metal atoms in the polarization cell 6 to be explained later) by allowing the degradation of the alloy to be continuously monitored. If the purity of the xenon gas and diluent gas is not particularly low, only a single-layer drying unit may be sufficient. If the purity of the xenon gas and diluent gas is high, the drying unit 3 can even be omitted.

The mixed gas that has passed through the drying unit 3 is introduced to the polarization cell 6 via a flowmeter 5. The polarization cell 6 in this embodiment is a cylindrical vessel formed of a heat-resistant glass such as Pyrex (registered trademark). The polarization cell 6 is located under a magnetic field provided by a special magnetic field generator (not shown) or under a uniform magnetic field selected from fringe fields of an NMR or MRI equipment. The strength of the magnetic field is, for example, approximately 10 mT or so.

An alkali metal can be stored inside the polarization cell 6. By introducing the mixed gas while evaporating the alkali metal by heating, the mixed gas is made to contact the alkali metal vapor. In this embodiment, rubidium (Rb) is used as the alkali metal, however, caesium (Cs), sodium (Na) and the like are also usable.

An excitation light source 7, which is composed of a laser light source or the like, is positioned above the polarization cell 6. Light emitted from the excitation light source 7 is circularly polarized via a glass fiber 71 and a quarter wavelength plate (lambda/4 plate) 72, and then emitted into the polarization cell 6 to produce polarized xenon gas.

A condenser 9 is provided downstream of the polarization cell 6. By the operation of a polarized gas transfer pump 61 connected to the condenser 9, the pressures inside the polarization cell 6 and the condenser 9 can be simultaneously reduced. Pressure control valves 62a,62b are positioned upstream and downstream of the polarization cell 6, respectively. By controlling the openings of the pressure control valves 62a,62b while monitoring a pressure gauge 63, the polarization cell 6 can be maintained at a desirable pressure that is lower than atmospheric pressure. The pressure inside the polarization cell 6 may be manually controlled, or may be automatically controlled using an electronic control unit such as a constant vacuum controller (e.g., model: VCG, manufactured by Okano Works, Ltd.). In this method, while monitoring the values detected by the pressure gauge 63, the degree to which the pressure control valve 62b is opened can be automatically controlled using an electromagnetic valve. This method is particularly effective when the pressure inside the polarization cell 6 is maintained at a low pressure, such as 0.05 atm or less. The polarization cell 6 is covered with a casing 65, and a high-temperature gas (for example, 110° C.) supplied from a hot-air blower 66 can be introduced into the casing 65. The high-temperature gas thus introduced is discharged out of the casing 65 through a light inlet or other air spaces at the top of the casing 65.

The condenser 9 is composed of a cold trap that is capable of storing a coolant L inside the container, and comprises an encapsulated-type reservoir tank 91 that is sunk in the coolant L. Through the suction by the polarized gas transfer pump 61, the polarized xenon gas produced in the polarization cell 6 as a mixture gas with a diluent gas is introduced to the condenser 9, then cooled by heat exchange with the coolant L in a spiral heat exchanger 92 and introduced to the reservoir tank 91. The diluent gas is thereby condensed and stored in the reservoir tank 91, and the polarized xenon gas is supplied to the NMR equipment 8 via the polarized gas transfer pump 61. The NMR equipment 8 may be an MRI device or other equipment that uses the polarized xenon gas. In order to prevent a reduction in the polarization rate of the polarized xenon gas, the condenser 9 is preferably located under a magnetic field and the direction of the magnetic field applied is preferably along that of the spin of the polarized gas. The fringe field of the NMR or MRI equipment may be used as the source of magnetic field; however, it is preferable that the condenser 9 be situated in a strong magnetic field of 0.2 T or higher, and preferably from approximately 1 to 2 T, using a magnetic field generation device (not shown).

The polarized xenon gas from the polarization cell 6 to the NMR equipment 8 may also be supplied by a separately provided feed pipe 64 in addition to the suction using the polarized gas transfer pump 61. A diaphragm pump that has excellent corrosion resistance and that is free from contamination by oil and like impurities is desirably used as the polarized gas transfer pump 61, and a pump that does not use a magnet nor a magnetic material in the motor section, gas flow section, and the like, is more preferable. This arrangement prevents the depolarization of the polarized xenon gas passing through and allows a high polarization rate to be maintained.

The condensed liquid of the diluent gas collected in the reservoir tank 91 is warmed up to room temperature and re-vaporized while it passes through the spiral heat exchanger 94 outside the condenser 9 by the suction of the diluent gas transfer pump 93. In this way the re-vaporized diluent gas joins the diluent gas supplied from the supply source 1b and re-circulates to the polarization cell 6. With the condensed liquid being collected in the reservoir tank 91 and steadily sucked, the supply of the diluent gas from the supply source 1b becomes unnecessary. In this arrangement, the diluent gas is steadily re-circulated passing through the polarization cell and the reservoir tank, while the xenon gas is steadily supplied from the supply source 1a and pumped out by the transportation pump 61. A diaphragm pump with excellent corrosion resistance is preferably used as the diluent gas transfer pump 93, for example, product name: N820.3FT.18, manufactured by KNF Neuberger GmbH. Also, the condensed liquid of the diluent gas may be actively heated instead of the heat exchange with room temperature air in the heat exchanger 94. A gas having a boiling point higher than room temperature may also be used as the diluent gas. In this case, the supply source 1b is a liquid container equipped with a heater, and heating must be conducted so that the liquid does not condense in the mass flow controller 2b itself or in the flow-path from the liquid container to the mass flow controller 2b. A liquid having a boiling point of approximately 60° C. or lower may be used. Precisely speaking, the usable liquid depends on the operable temperature range as well as the operating pressure difference of the mass flow controller, the operating partial pressure of the diluent gas, and the nature of the vapor pressure-temperature curve of the diluent gas. When a diluent gas having a high boiling point is used, the condensed liquid can be recycled in the form of a liquid by using a liquid pump to return it to the supply source 1b.

It is preferable that a check valve 95 be provided between the heat exchanger 94 and the diluent gas transfer pump 93. This arrangement reliably prevents the diluent gas from flowing backward, i.e., from the supply source 1b to the reservoir tank 91, when the diluent gas transfer pump 93 does not operate normally.

The polarized xenon gas manufacturing supply device 1 having the above structure uses, for the diluent gas that is added to increase the polarization rate of the polarized xenon gas, a high-boiling-point gas whose boiling point is higher than that of xenon gas. Therefore, the high-boiling-point gas can be condensed and separated by the condenser 9 using the difference in the boiling points between the xenon gas and the high-boiling-point gas, while suppressing the reduction of the polarization rate of the polarized xenon gas. As a result, the diluent gas can be continuously removed from the mixed gas, allowing a highly concentrated and highly polarized xenon gas to be continuously manufactured and supplied to an NMR equipment 8 or the like. In this embodiment, the use of isobutene as the diluent gas makes the concentration of xenon in the polarized gas increased while maintaining the polarization rate of xenon at the same level as that produced by a conventional method. This enhances the total sensitivity available by the NMR equipment 8 or the like.

The temperature of the coolant L in the condenser 9 need to be set in such a manner that the polarized xenon gas will not be condensed and only the high-boiling-point gas will be condensed. For example, when the high-boiling-point gas is isobutene (boiling point: −6.9° C.), the temperature of the coolant L is preferably −50° C. or less, and more preferably almost as low as the temperature of dry ice (−78° C.).

Condensation and separation by the condenser 9 is usually achieved by liquefying a high-boiling-point gas. However, this may also be done by solidification in which the high-boiling-point gas is collected by sublimation at a temperature lower than its melting point. In particular, when the xenon gas is easily dissolved in the liquefied high-boiling-point gas, solidification and separation will be an effective way to prevent the spin relaxation of the polarized xenon gas. When the high-boiling-point gas has a tendency of sublimation, solidification by sublimation is regarded as equivalent to condensation and separation, and the polarized xenon gas can be concentrated thereby.

Figure 10:
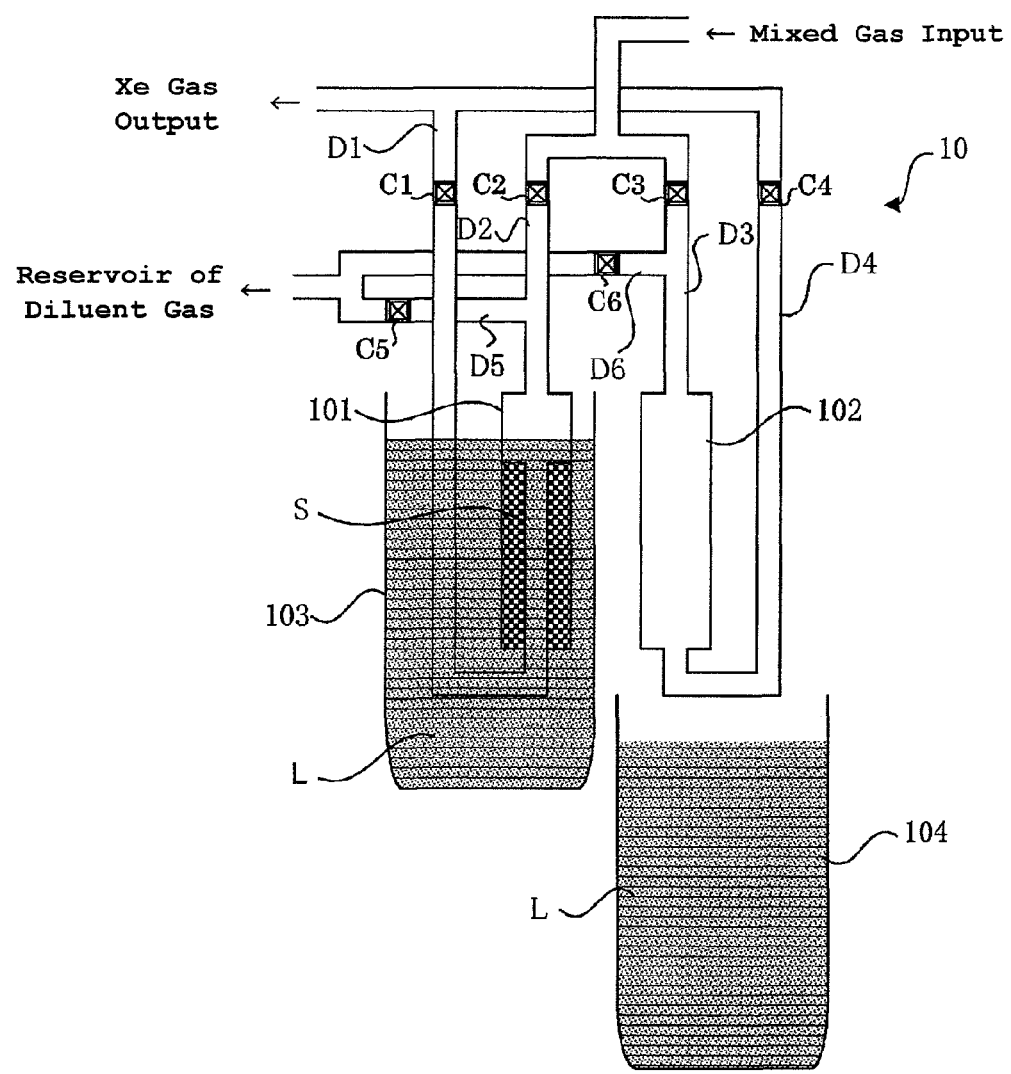
FIG. 10 is a schematic diagram illustrating a modified example of the principal parts of the polarized xenon gas manufacturing supply device shown in FIG. 1.

When the diluent gas is collected by solidification, a solidification and separation unit 10 shown in FIG. 10, for example, can be used instead of the condenser 9 shown in FIG. 1. The solidification and separation unit 10 comprises two separation cells 101,102. A mixed gas of polarized xenon gas and diluent gas is fed to one of the separation cells 101,102 via the branched mixed gas flow paths D2,D3. Diluent gas flow paths D5,D6, through which the diluent gas passes, and xenon gas flow paths D1,D4, through which the xenon gas separated from the diluent gas passes, are connected to the separation cells 101,102, respectively. The flow paths D1 to D6 are provided with stop cocks C1 to C6, respectively, for opening or closing the flow paths. The solidification and separation unit 10 further comprises cryostats 103,104 for storing low-temperature coolant L corresponding to the separation cells 101,102, respectively. Each of the coolant storage tanks 103, 104 is structured so that it is movable vertically by a lifting unit (which is not shown), and the separation cells 101,102 are cooled separately by lifting the coolant storage tanks 103,104, respectively, and immersing the cells into the coolant L.

As shown in FIG. 10, in the solidification and separation unit 10, when the stop cocks C1,C2 are opened so as to supply the mixed gas to the separation cell 101 while lifting up the coolant storage tank 103 gradually to cool the separation cell 101, the diluent gas contained in the mixed gas solidifies in the separation cell 101 mainly in the vicinity of the liquid surface of the coolant L and below thereof. As the coolant storage tank 103 is lifted, the diluent gas is collected in the form of solid S from the lower portion to the upper portion in the separation cell 101, the solidification and separation of the diluent gas is achieved. When the separation cell 101 is filled with the solid S of the diluent gas, the stop cocks C1,C2 are closed and the stop cocks C3,C4 are opened, and the coolant storage tank 104 is then lifted gradually. The solidification and separation of the diluent gas in another cell, i.e., the separation cell 102, can thereby be performed in a similar way. The diluent gas can be recovered from the separation cell 101 by increasing the temperature of the separation cell 101 by lowering the coolant storage tank 103, opening the stop cock C5, and sucking the diluent gas from the separation cell 101 using a pump or the like. When the diluent gas is removed entirely from the separation cell 101, the separation cell 101 can take over the separation cell 102 in separating the diluent gas by solidification.

In the present embodiment, the condensation of the high-boiling-point gas is also conducted under a reduced pressure by operating the polarized gas transfer pump 61. This aims to reduce the amount of polarized xenon gas dissolved in the condensed liquid and prevent a reduction of the amount of polarized xenon gas supplied. This arrangement is particularly effective when the concentration of the diluent gas is as high as approximately 90%, or the condensation temperature is almost as low as the temperature of dry ice. If the pressure inside the reservoir tank 91 of the condenser 9 is unduly low, the high-boiling-point gas will also be undesirably suctioned by the transfer pump 61. This may cause the contamination of the xenon gas by the high-boiling-point gas and reduce the separation efficiency. Therefore, it is preferable that the pressure inside the reservoir tank 91 be set higher than the vapor pressure of the high-boiling-point gas at the condensation temperature, and lower than the vapor pressure of Xe at the same temperature. When the high-boiling-point gas is isobutene (vapor pressure: 12.5 Torr (−79.1° C.) or 2,017 Torr (22.1° C.)), considering that the vapor pressure of Xe is 1 atm (−108° C.), 3.44 atm (−83° C.), or 5.15 atm (−73° C.), it is preferable to set the pressure inside the reservoir tank 91 in the range of approximately 0.05 to 1 atm.

The operation of the polarized gas transfer pump 61 reduces the pressure not only inside the condenser 9 but also inside the polarization cell 6. This reduces the collisions between the spins of the generated polarized xenon gas, and accordingly suppresses the depolarization caused by the collisions. A polarized xenon gas with a high polarization rate is thereby produced.

An improvement in the polarization rate can be observed as long as the pressure inside the polarization cell 6 is lowered from the atmospheric pressure, but setting the pressure inside the polarization cell 6 to 0.6 atm or less, in particular, allows a remarkable improvement in the polarization rate to be attained. However, if the pressure inside the polarization cell 6 becomes unduly low, a drawback will appear in which a reduction in the quenching effect due to the lowering of the partial pressure of the diluent gas exceeds the effect of the polarization rate improvement attained by suppressing the collision of polarized xenon gas. This tends to lower the polarization rate. And also it becomes not easy to maintain an airtight condition rigorously. Therefore, it is preferable that the pressure inside the polarization cell 6 be 0.05 atm or more and 0.6 atm or less, and more preferably 0.05 atm or more and 0.2 atm or less.

Reducing the pressure in the polarization cell 6 and the condenser 9 is not indispensable for achieving the effect of the present invention, and the polarization cell 6 and the condenser 9 may be set at atmospheric pressure. That is, the device of the present invention can also be used for manufacturing and supplying a polarized rare gas by re-circulating diluent gas at atmospheric pressure.

The diluent gas added to the xenon gas may contain a small amount of gas components other than the high-boiling-point gas that achieves the quenching effect, as long as they do not significantly lower the concentration of the polarized xenon gas. For example, the depolarization caused by the spins excited in the polarization cell 6 colliding against the inner wall of the container may be prevented by adding a buffer gas, such as helium ($^4$He). However, because reducing the pressure inside the polarization cell 6 can improve the polarization rate without using a buffer gas, reducing the pressure inside the polarization cell 6 is an effective way of achieving the excellent polarization rate of the polarized xenon gas without lowering in the concentration of xenon in the condenser 9 by adding a buffer gas.

The diluent gas separated in the condenser 9 may be stored in the reservoir tank 91 until the tank becomes full and then removed batchwise. However, the diluent gas can be re-circulated from the condenser 9 to the polarization cell 6 while mixed with the diluent gas supplied from the supply source 1*b* by constantly operating the diluent gas transfer pump 93. Re-circulation of the diluent gas as such can reduce the production cost of the polarized xenon gas. When isobutene or a like organic gas other than nitrogen is used as the diluent gas, the re-circulation type device is particularly advantageous since it can reduce the production cost, and can be devoid of the extra devices for collecting, storing and purifying the diluent gas. When the xenon gas is highly diluted to increase the polarization rate, the amount of diluent gas used becomes unduly large. Conventional techniques require a troublesome treatment of the used diluent gas; however, the diluent gas can be recycled in the present invention as described above to improve cost effectiveness and performance. More specifically, when pure (100%) xenon gas is desired as a polarized gas, the present invention can give a polarization rate of 10% or more, i.e., it improves the polarization rate more than 10 times compared to that given in conventional methods. For example, when an MRI system is provided with the polarized xenon gas manufacturing supply device of the present invention, high-sensitivity MRI (magnetic resonance imaging) measurement of organs and the like can be continuously conducted.

EXAMPLES

The present invention is explained in detail below with reference to Examples. However, the scope of the invention is not limited to the Examples described below.

Example A

Using Isobutene as the Diluent Gas

Relationship Between Diluent Gas and Sensitivity

A cylindrical polarization cell (diameter: 60 mm, length: 30 cm) storing rubidium as an alkali metal was placed in a 110° C. high-temperature bath. A mixture of a xenon gas and a diluent gas was introduced to the polarization cell. After the inside pressure of the polarization cell was set to 0.15 atm, the cell was emitted for 20 minutes with the circularly polarized light which was obtained by converting a laser light with wavelength of 795 nm and output of 90 W emitted from the excitation light source. While feeding the gas in the cell into an NMR sample tube, NMR signals were measured to evaluate the signal-to-noise ratio (SNR). A similar measurement was conducted using a standard sample for SNR measurement. Based on the ratio between the SNR of the gas in the cell and that of a standard sample, the polarization rate $P_{Xe}$ of $^{129}$Xe was obtained using the formula below.

$$P_{Xe} = \frac{(S/N)_p}{(S/N)_e} \cdot \frac{(Xe\%)_e}{(Xe\%)_p} \cdot \frac{\sqrt{NEX_e}}{\sqrt{NEX_p}} P_e \quad [\text{Math. 1}]$$

A polarized xenon gas was produced using isobutene or nitrogen as the diluent gas, giving Comparative Examples 1 and 2, respectively, and then the polarized xenon gas was introduced into an NMR sample tube without trapping of the diluent gas. In contrast, the case wherein isobutene was used as the diluent gas and the diluent gas was trapped before introducing the polarized xenon gas into an NMR sample tube is defined as Example 1. Table 1 shows the results. The low pressure was achieved using a diaphragm pump (product name: N86 KV.18, manufactured by KNF Neuberger GmbH), and the pressure was controlled by adjusting the flow rate using a high-precision valve (product name: metering-valve SS6MM, manufactured by Swagelok Co.). The pressure was measured using a Handy Manometer Model PG-100

102RP (manufactured by Copal Electronics). The gas flow rate was measured using a flowmeter (model name: FT-1100, manufactured by Kusano Science Corporation) that had been calibrated in advance.

In order to trap the diluent gas, a spiral glass tube (inside diameter: approximately 8 mm) was immersed in a coolant thermostated in cryostat. A reservoir tank (approximately 50 ml) was attached at the end of the spiral tube for storage of the condensed liquid. During a recirculation experiment of the diluent gas, the supply of the gas from the diluent gas cylinder was stopped by closing the cock and the diluent gas was made to flow into a mass flow controller by suctioning from the bottom of the reservoir tank using a glass tube with an inside diameter of approximately 4 mm. A diaphragm pump (model number: N820.3 FT.18) was used as the suction pump, which had a suction power stronger than that of the diaphragm pump described above. The suction speed of the diluent gas was controlled by the cock located upstream from the pump.

ratio of Example 1 increased to approximately 4 times that of Comparative Example 1; therefore, a significant increase in sensitivity was confirmed. Under these flow rate conditions, the proportions of the diluent gas were 20% and 30%, respectively. Here, if nitrogen gas were used as the diluent gas, a signal-to-noise ratio that is 3.5 to 5 times that of the case where 100% xenon gas is used could be obtained (see Non-patent Literature 1). Therefore, the increase of approximately 4 times in the signal-to-noise ratio under the flow rate of 10 to 20 cc/min corresponds to an increase of 14 to 20 times when compared to the result of using 100% xenon gas. In other words, the signal was increased 14 to 20 times compared to that of polarization achieved by using 100% xenon.

Relationship Between Pressure Inside Polarization Cell and Sensitivity

Measurements as described above were conducted after setting the pressure inside the polarization cell to 0.15 atm and 1 atm and introducing the resultant polarized xenon gas

TABLE 1

|  | Xe FR (cc/min) | N2 FR (cc/min) | isobutene (cc/min) | Tot FR (cc/min) | Xe % (%) | p (atm) | SNR (a.u.) | P (%) |
|---|---|---|---|---|---|---|---|---|
| Example 1 | | | | | | | | |
| trap | 2.2 | | 69 | 71.2 | 3 | 0.10 | 1576 | |
| trap | 4.3 | | 69 | 73.3 | 6 | 0.09 | 3003 | |
| trap | 8.5 | | 69 | 77.5 | 11 | 0.10 | 6837 | |
| trap | 17 | | 69 | 86 | 20 | 0.12 | 6997 | |
| trap | 30 | | 69 | 99 | 30 | 0.14 | 5343 | |
| trap | 4.3 | | 138 | 142.3 | 3 | 0.10 | 1636 | |
| Comparative | 2.2 | | 69 | 71.2 | 3 | 0.18 | 891 | 50.7 |
| Example 1 | 4.3 | | 69 | 73.3 | 6 | 0.18 | 1262 | 37.8 |
|  | 8.5 | | 69 | 77.5 | 11 | 0.18 | 1642 | 26.9 |
|  | 17 | | 69 | 86 | 20 | 0.18 | 1891 | 18.6 |
|  | 30 | | 69 | 99 | 30 | 0.19 | 1875 | 12.2 |
|  | 4.3 | | 138 | 142.3 | 3 | 0.23 | 332 | 26.7 |
| Comparative | 2.2 | 69 | | 71.2 | 3 | 0.19 | 1130 | 61.1 |
| Example 2 | 4.3 | 69 | | 73.3 | 6 | 0.19 | 1476 | 43 |
|  | 8.5 | 69 | | 77.5 | 11 | 0.19 | 1794 | 28.9 |
|  | 17 | 69 | | 86 | 20 | 0.19 | 2016 | 19 |
|  | 30 | 69 | | 99 | 30 | 0.2 | 2092 | 13.4 |
|  | 4.3 | 138 | | 142.3 | 3 | 0.27 | 771 | 55.6 |

Table 1 shows, in columns from left to right, the xenon gas flow rate, nitrogen gas flow rate, isobutene gas flow rate, total flow rate, xenon gas concentration (volume concentration), pressure inside the polarization cell, signal-to-noise ratio (SNR), and polarization rate (P).

Figure 2:
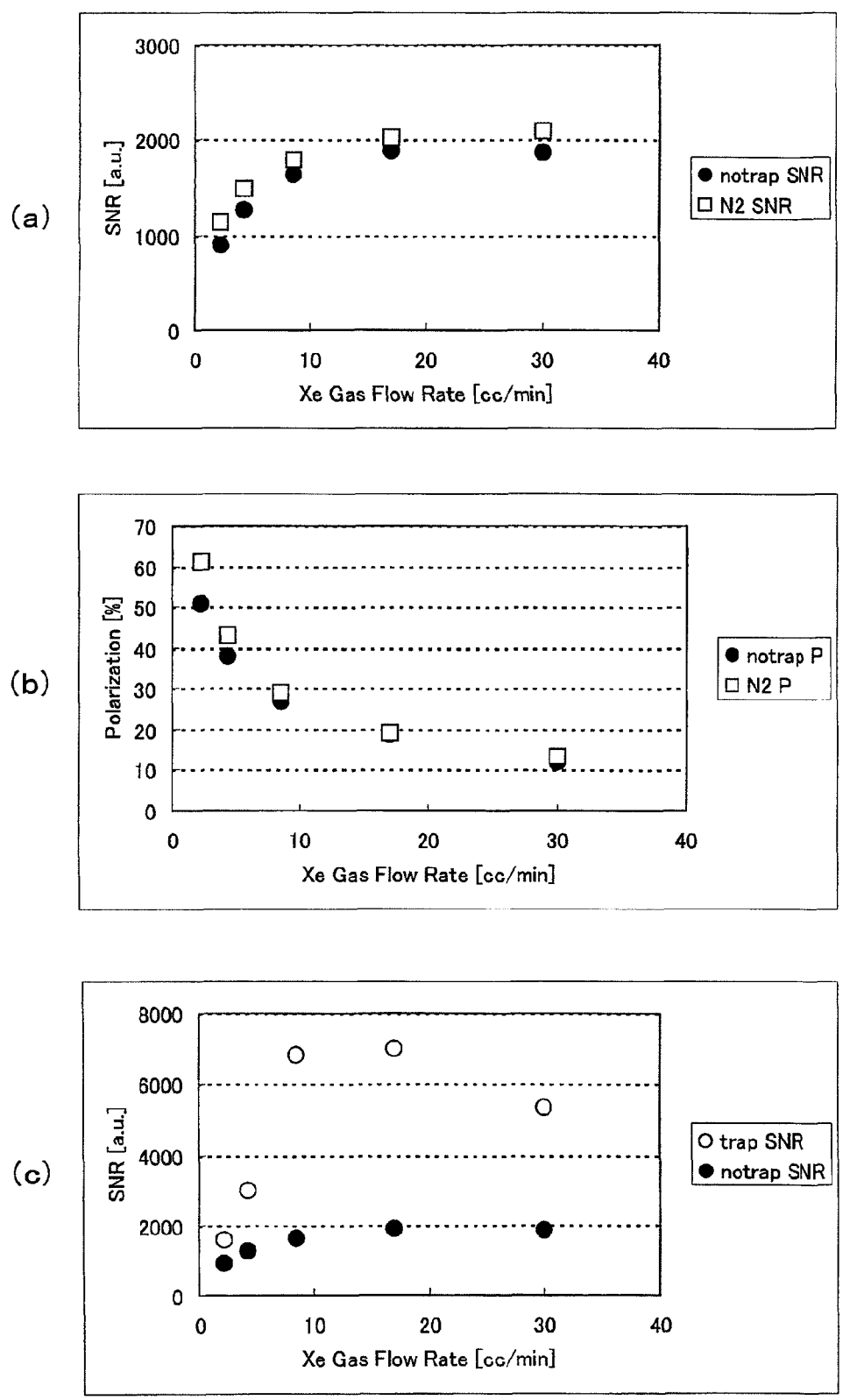
FIG. 2 is a graph showing the measurement results of Example A.

The graphs in FIG. 2(a) and FIG. 2(b) show the signal-to-noise ratio (SNR) and polarization rate for Comparative Example 1 and Comparative Example 2, respectively. In FIG. 2(a) and FIG. 2(b), the black dots (●) indicate the results of Comparative Example 1 where isobutene is used as the diluent gas, and squares (□) indicate the results of Comparative Example 2 where nitrogen is used as the diluent gas. Regardless of the flow rate of the xenon gas, almost the same results were obtained in Comparative Examples 1 and 2 in the signal-to-noise ratio as well as polarization rate P. This indicates that the same degree of quenching effect compared with a conventional technique was obtained even though a novel gas, isobutene was used as the diluent gas.

The graph in FIG. 2(c) shows the signal-to-noise ratio of Example 1 and Comparative Example 1, wherein the white dots (○) indicate the results of Example 1, in which the diluent gas was trapped at a trap temperature of −77° C., and the black dots (●) indicate the results of Comparative Example 1 without trapping of the diluent gas. When the flow rate of xenon gas was 10 to 20 cc/min., the signal-to-noise into the NMR sample tube without trapping the diluent gas. The results are shown in FIG. 3(a) and FIG. 3(b) for the gas mixture of 3% xenon in isobutene.

Figure 3:
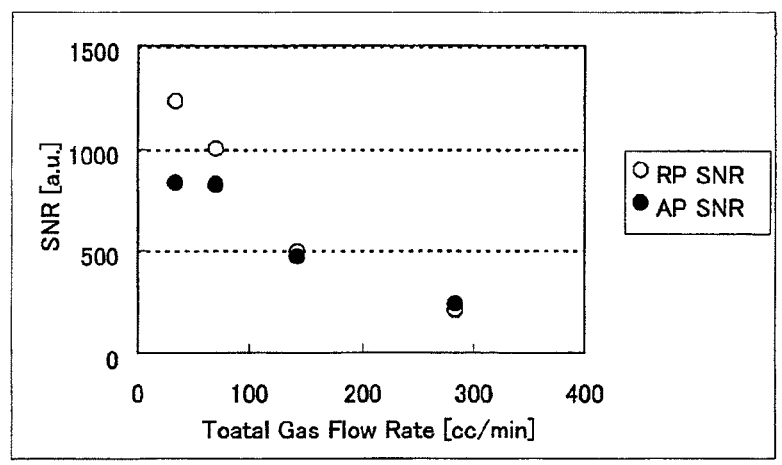
FIG. 3 is a graph showing the measurement results of Example A.
Figure 3:
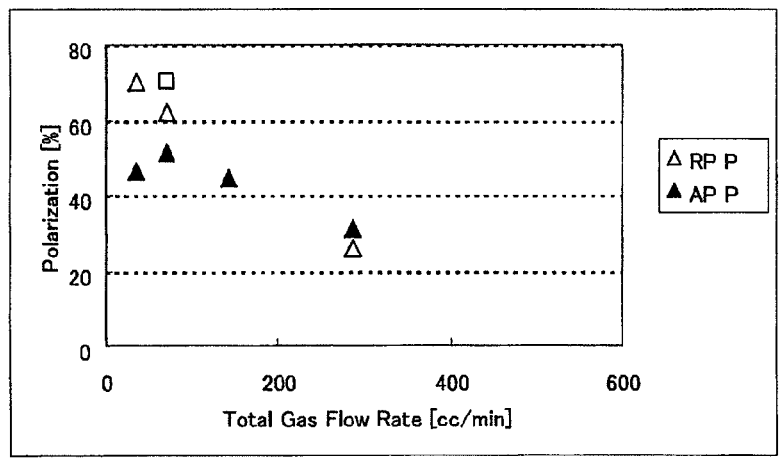

FIG. 3(a) and FIG. 3(b) show the signal-to-noise ratio and the polarization rate, respectively, relative to the total flow rate of the entire gas, wherein the white dots (○) and white triangles (△) indicate the results measured at a reduced pressure (set-pressure: 0.15 atm), and the black dots (●) and black triangles (▲) indicate the results measured at atmospheric pressure (set-pressure: 1 atm). When the total flow rate was approximately 100 cc/min or less, the signal-to-noise ratio and the polarization rate both remarkably increased by reducing the pressure in the polarization cell.

Relationship Between Magnetic Field in Condenser and Sensitivity

Table 2 shows the experimental results regarding the effects of a magnetic field applied to the condenser. Here, isobutene was used as the diluent gas. Using a fringe field of the superconducting NMR equipment, a comparison was made between the case where the condenser was located closest to the surface of the magnet body (0.045 T) and the case where it was placed approximately 70 cm away from the surface of the magnet body (0.002 T). In the case where the condenser was placed under the stronger magnetic field, a larger increase in the SNR was observed (No. 1 and No. 2).

The polarization rate of Xe in No. 1 and No. 2 was slightly reduced compared to the case where the diluent gas was not removed by condensation by keeping the condenser at ordinary temperatures (No. 3); however, the reduction in the polarization rate could probably be prevented by further increasing the strength of the magnetic field applied to the condenser.

TABLE 2

| Experiment No. | Magnetic field applied | Pressure in polarization cell | Condenser temperature | SNR | Polarization rate |
|---|---|---|---|---|---|
| 1 | 0.002 T | 0.18 atm. | −70° C. | 2859 | 8% |
| 2 | 0.045 T | 0.18 atm. | −70° C. | 3458 | 10% |
| 3 | 0.002 T | 0.25 atm. | 23° C. (no condensation) | 880 | 12% |

Note:
Measurements were conducted with an Xe flow rate of 17 cc/min and an isobutene flow rate of 69 cc/min (Xe 20%).

Example B

Using Propene as the Diluent Gas

Table 3 shows the results of Example 2 conducted using propene ($C_3H_6$, $H_3CCH\!=\!CH_2$, boiling point: −47.7° C., melting point: −185° C.) as the diluent gas instead of nitrogen. The experiments were conducted in the same manner as in Example 1 except that the polarization cell had a diameter of 60 mm with a length of 20 cm and that the laser power used for excitation was 90 W and the temperature of the cryostat used for the condensation of propene was −114° C. Because Example 2 differed in the cell size and laser power from those in Comparative Examples 1 and 2, the comparative experiments were re-conducted under the same conditions as in Example 2 and these experiments were defined as Comparative Examples 3 and 4.

Figure 4:
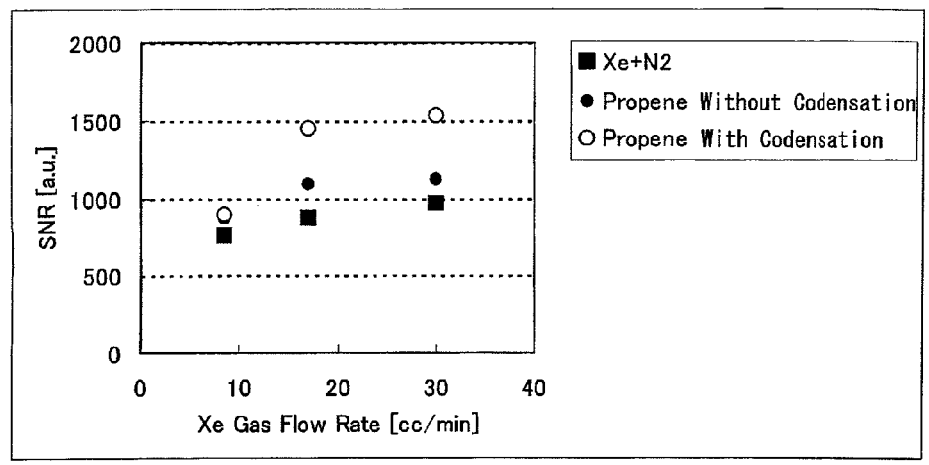
FIG. 4 is a graph showing the measurement results of Example B.

The graph in FIG. 4 shows the signal-to-noise ratio (SNR) in Table 3. In FIG. 4, the white dots (○) indicate the results of Example 2, the black dots (●) indicate the results of Comparative Example 3, and the squares (■) indicate the results of Comparative Example 4. The SNR was improved when the Xe content was in between 11 and 30% and the Xe flow rate was in between 8.5 and 30 cc/min. In particular, when the Xe content was in between 20 and 30% and the Xe flow rate was in between 17 and 30 cc/min, the SNR was increased approximately 1.5 times.

Example C

Using 2-Methyl-2-Butene as the Diluent Gas

Table 4 shows the results of experiments (Example 3) conducted using 2-methyl-2-butene ($C_5H_{10}$, $(CH_3)_2C\!=\!CH(CH_3)$, boiling point: 38° C., melting point: −134° C.) as the diluent gas instead of nitrogen. The experiments were conducted in the same manner as in Example 1 except that the polarization cell had a diameter of 60 mm with a length of 10 cm and that the laser power used for excitation was 60 W and the temperature of the cryostat used for the condensation of 2-methyl-2-butene was −65° C. Because Example 3 differed in the cell size and laser power from those in Comparative Examples 1 and 2, the comparative experiment was re-conducted under the same conditions as in Example 3 and the experiment was defined as Comparative Example 5. Although 2-methyl-2-butene is a liquid at ordinary temperatures, the vapor pressure of 0.15 atm can be sufficiently supplied from the liquid under the experimental condition of room temperature because its boiling point is close to room temperature. However, since most of the 2-methyl-2-butene passed through the transfer pump is automatically condensed at room temperature under atmospheric pressure (1 atm), it was difficult to collect the data for 2-methyl-2-butene under condition of without-condensation (NoTrap) which can be compared with the Comparative Example 2 above. For this reason, only the Comparative Example 5 is listed as for the comparative experiment in Example C that can be compared with Example 3.

Figure 5:
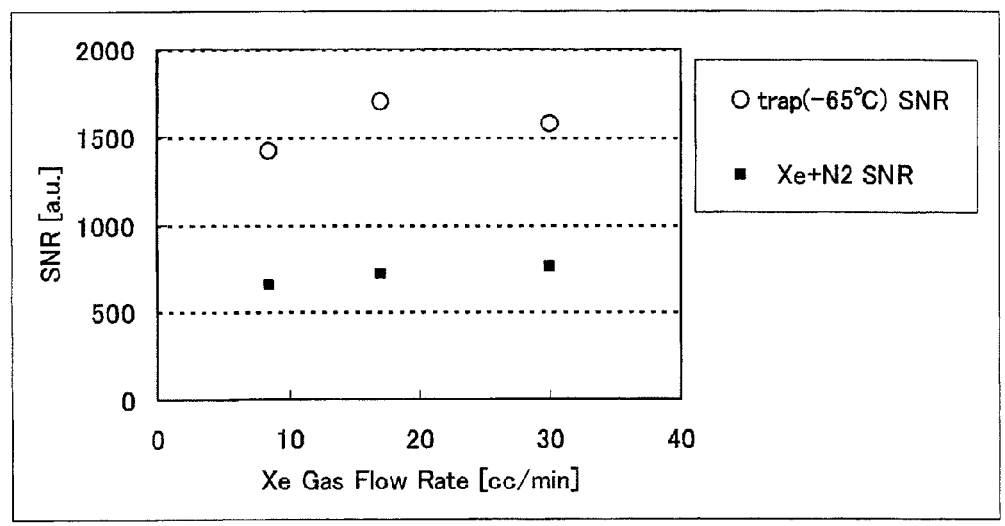
FIG. 5 is a graph showing the measurement results of Example C.

The graph in FIG. 5 shows the signal-to-noise ratio (SNR) in Table 4. In FIG. 5, white dots (○) indicate the results of Example 3, and squares (■) indicate the results of Comparative Example 5. When the Xe content was in between 11 and 30% and the Xe flow rate was in between 8.5 and 30 cc/min, the SNR was increased 2 times.

TABLE 3

Example B (Propene, a 90 W laser, and a 20 cm cell were used)

| | Xe flow rate cc/min | $N_2$ flow rate cc/min | $C_3H_6$ flow rate cc/min | Total flow rate cc/min | Xe content % | Cell pressure P atm | SNR (a.u.) | Polarization rate P % |
|---|---|---|---|---|---|---|---|---|
| Ex. 2 | 8.5 | | 69 | 77.5 | 11 | 0.11 | 889 | |
| $C_3H_6$ Condensation (−114° C.) | 17 | | 69 | 86 | 20 | 0.14 | 1446 | |
| | 30 | | 69 | 99 | 30 | 0.16 | 1528 | |
| Comp. Ex. 3 | 8.5 | | 69 | 77.5 | 11 | 0.33 | 870 | 26 |
| $C_3H_6$ No Condensation | 17 | | 69 | 86 | 20 | 0.33 | 1089 | 18 |
| | 30 | | 69 | 99 | 30 | 0.34 | 1121 | 12 |
| Comp. Ex. 4 | 8.5 | 69 | | 77.5 | 11 | 0.33 | 757 | 21 |
| $N_2$ | 17 | 69 | | 86 | 20 | 0.33 | 868 | 14 |
| | 30 | 69 | | 99 | 30 | 0.34 | 963 | 10 |

TABLE 4

Example C (2-Methyl-2-butene, a 60-W laser, and a 10-cm cell were used)

| | Xe flow rate cc/min | $N_2$ flow rate cc/min | $C_5H_{10}$ flow rate cc/min | Total flow rate cc/min | Xe content % | Cell pressure p atm | SNR (a.u.) | Polarization rate P % |
|---|---|---|---|---|---|---|---|---|
| Example 3 | 8.5 | | 69 | 77.5 | 11 | 0.10 | 1414 | |
| $C_5H_{10}$ Conden- | 17 | | 69 | 86 | 20 | 0.11 | 1692 | |
| sation (−65° C.) | 30 | | 69 | 99 | 30 | 0.12 | 1568 | |
| Comparative | 8.5 | 69 | | 77.5 | 11 | 0.16 | 671 | 22 |
| Example 5 | 17 | 69 | | 86 | 20 | 0.17 | 754 | 14 |
| $N_2$ | 30 | 69 | | 99 | 30 | 0.23 | 784 | 9.4 |

Example D

Using Furan as the Diluent Gas

Table 5 shows the results of experiments (Example 4) conducted using furan ($C_4H_4O$, boiling point: 31° C., melting point: −85.68° C.) as the diluent gas instead of nitrogen. The experiments were conducted in the same manner as in Example 1 except that the polarization cell had a diameter of 60 mm with a length of 10 cm and that the laser power used for excitation was 60 W and the temperature of the cryostat used for the condensation of furan was −65° C. Because Example 4 differed in the cell size and laser power from those in Comparative Examples 1, the comparative experiment was re-conducted under the same conditions as in Example 4 and the experiment was defined as Comparative Example 6. Similar to Example C described above, the data corresponding to the condition of without-condensation (NoTrap)(corresponding to Comparative Example 2) were not collected, because furan is liquid at ordinary temperatures.

Figure 6:
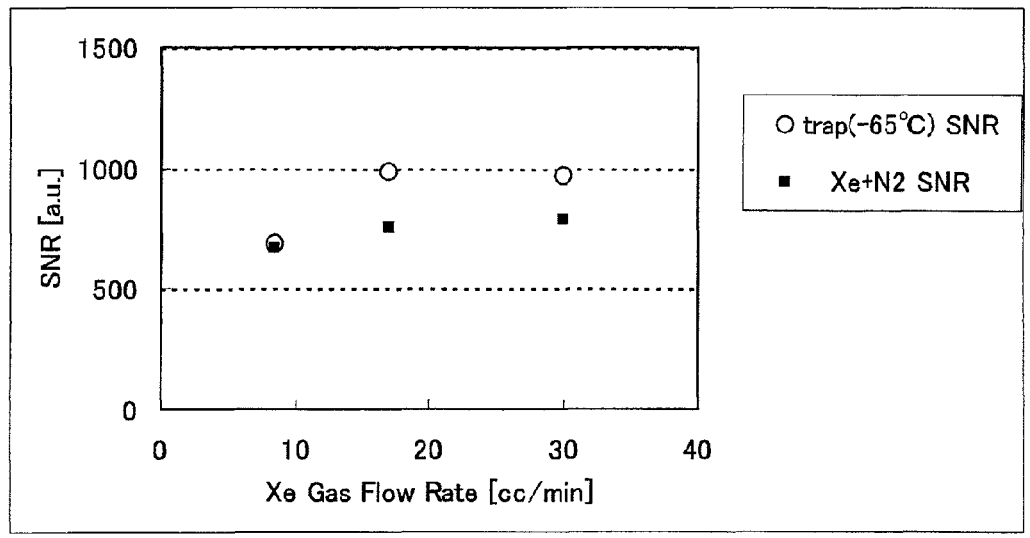
FIG. 6 is a graph showing the measurement results of Example D.

The graph in FIG. 6 shows the signal-to-noise ratio (SNR) in Table 5. In FIG. 6, white dots (○) indicate the results of Example 4, and squares (■) indicate the results of Comparative Example 6. When the Xe content was in between 20 and 30% and the Xe flow rate was in between 17 and 30 cc/min, the SNR increased by 20 to 30%. The SNR was also increased in Example 4; however, the percentage of increase was smaller than those observed in case of Examples 1, 2 and 3 described above. This is probably because Xe is highly soluble in liquid furan and because the dissolved Xe is depolarized with a short relaxation time in the condensed furan. Another reason may be that the quenching effect of furan is weaker than that of nitrogen.

Example E

Separating Furan Used as the Diluent Gas by Solidification

Table 6 shows the results of Example 5, wherein furan was used as the diluent gas as in Example D, but the furan was separated by solidification at a temperature lower than its melting point. The polarization cell had a diameter of 60 mm with a length of 20 cm. The laser power used for excitation was 90 W, and the temperature of the cryostat used for the condensation of furan was −105° C. Because Example 5 differed in the cell size and laser power from those in Comparative Examples 1, the comparative experiment was re-conducted under the same conditions as in Example 5 and the experiment was defined as Comparative Example 7.

Figure 7:
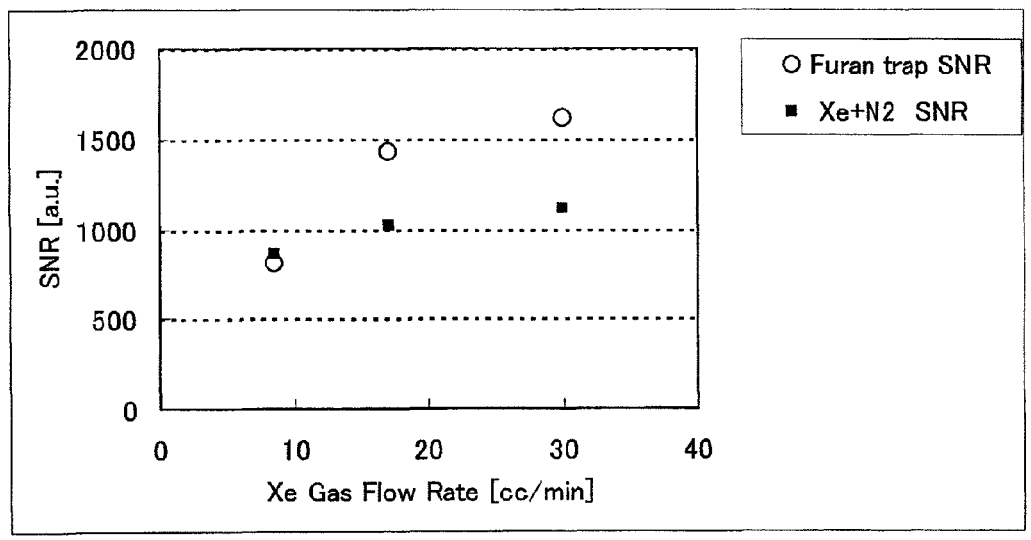
FIG. 7 is a graph showing the measurement results of Example E.

The graph in FIG. 7 shows the signal-to-noise ratio (SNR) from Table 6. In FIG. 7, the white dots (○) indicate the results of Example 5, and the squares (■) indicate the results of Comparative Example 7.

The SNR was increased by approximately 40 to 60% when the Xe content was in between 20 and 30% and the Xe flow rate was in between 17 and 30 cc/min. An increase percentage higher than that in Example 4 was obtained. This is probably because the polarized Xe became substantially insoluble in solid furan. This prevents the depolarization effect under the vapor-liquid equilibrium condition where a short relaxation time is encountered in a liquid state of furan.

TABLE 5

Example D (Furan, a 60 W laser, and a 10 cm cell were used)

| | Xe flow rate cc/min | $N_2$ flow rate cc/min | Furan flow rate cc/min | Total flow rate cc/min | Xe content % | Cell pressure p atm | SNR (a.u.) | Polarization rate P % |
|---|---|---|---|---|---|---|---|---|
| Example 4 | 8.5 | | 69 | 77.5 | 11 | 0.12 | 686 | |
| Furan Conden- | 17 | | 69 | 86 | 20 | 0.12 | 985 | |
| sation (−65☐) | 30 | | 69 | 99 | 30 | 0.13 | 964 | |
| Comparative | 8.5 | 69 | | 77.5 | 11 | 0.23 | 670 | 22 |
| Example 6 | 17 | 69 | | 86 | 20 | 0.23 | 766 | 14 |
| $N_2$ | 30 | 69 | | 99 | 30 | 0.24 | 826 | 10 |

TABLE 6

Example E (Furan, a 90 W laser, a 20 cm cell were used)

|  | Xe flow rate cc/min | N$_2$ flow rate cc/min | Furan flow rate cc/min | Total flow rate cc/min | Xe content % | Cell pressure p atm | SNR (a.u.) | Polarization rate P % |
|---|---|---|---|---|---|---|---|---|
| Example 5 | 8.5 |  | 69 | 77.5 | 11 | 0.12 | 809 |  |
| Furan Condensation (−105° C.) | 17 |  | 69 | 86 | 20 | 0.12 | 1424 |  |
|  | 30 |  | 69 | 99 | 30 | 0.13 | 1615 |  |
| Comparative Example 7 | 8.5 | 69 |  | 77.5 | 11 | 0.22 | 860 | 29 |
|  | 17 | 69 |  | 86 | 20 | 0.22 | 1013 | 19 |
| N$_2$ | 30 | 69 |  | 99 | 30 | 0.24 | 1109 | 14 |

Example F

Using Butane Mixed Gas as the Diluent Gas

Table 7 shows the results of Example 6 conducted using a mixture of nitrogen gas and butane gas as the diluent gas instead of nitrogen only. The experiments were conducted in the same manner as in Example 1 except that the polarization cell had a diameter of 60 mm with a length of 30 cm and that the laser power used for excitation was 90 W and the temperature of the cryostat used for the condensation of mixed gas was −74° C. Table 7 also shows the results of Example 7 that was conducted using a mixture of isobutene and butane as the diluent gas under the same conditions as in Example 6.

Figure 8:
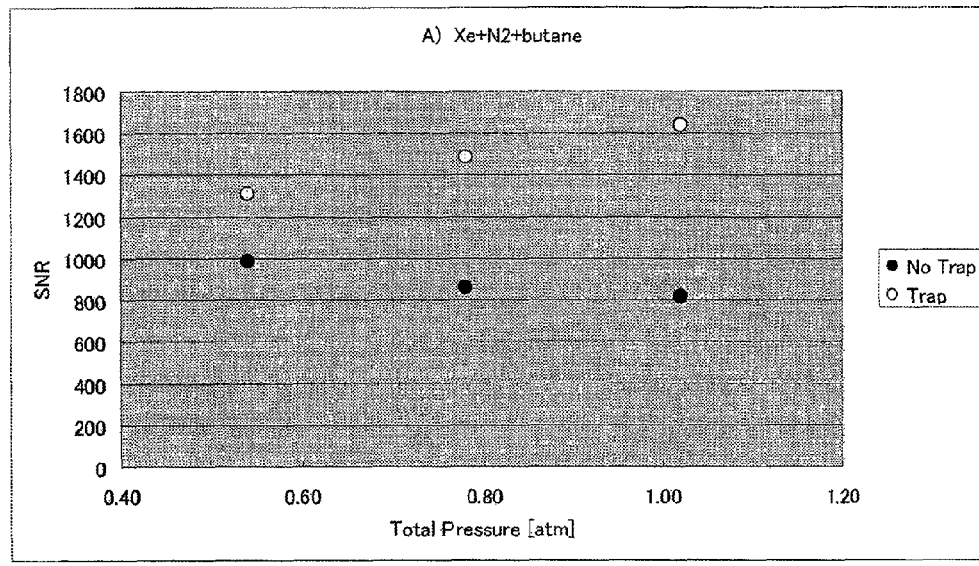
FIG. 8 is a graph showing the measurement results of Example F.
Figure 9:
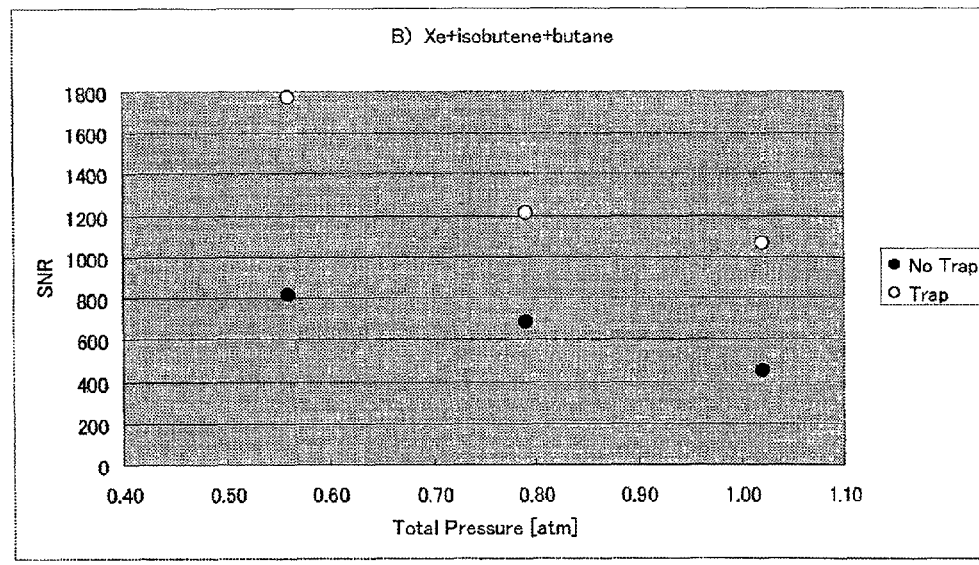
FIG. 9 is a graph showing the measurement result of Example F.

The graphs in FIGS. 8 and 9 show the signal-to-noise ratio (SNR) for Examples 6 and 7, respectively. In FIG. 8, the white dots (○) indicate the results of Example 6 and the black dots (●) indicate the results of the case wherein the diluent gas was not trapped. In FIG. 9, the white dots (○) indicate the results of Example 7 and the black dots (●) indicate the results of the case wherein the diluent gas was not trapped.

Comparison of FIG. 8 and FIG. 9 reveals following tendencies. Regarding the SNR observed without trapping the diluent gas, the diluent gas (a mixture of nitrogen and butane) in FIG. 8 exhibits slightly higher values than those given in FIG. 9, and the difference between the two becomes smaller as the pressure is decreased. In contrast, when the diluent gas is trapped, a greater increase in the SNR can be reached by using the diluent gas containing isobutene instead of nitrogen. This is because butane and isobutene are both condensed and separated out at the trapping temperature of −110° C. As shown in FIG. 9, such an increase in SNR becomes more remarkable as the total pressure is decreased.

The increase in SNR by condensation was smaller than the value estimated basing on the proportion of the gas removed by condensation. For example, when the flow rate is Xe=17, isobutene=8.6, and butane=20 cc/min, a 2.68 times increase in sensitivity is expected; however, the result actually obtained in the experiments was 2.18 times. One of the reasons for this is probably the depolarization caused by the relaxation of the Xe spins dissolved in the condensed liquid. In order to reduce such an adverse effect, the cooling method employed in trapping is important. Ideally, the diluent gas is solidified so as to reduce the solubility of Xe as much as possible. When the diluent gas is difficult to be separated by solidification and separation is made by condensation in liquid state, it is effective, for example, to design the geometrical shape of the condenser so that the contact area is reduced as much as possible between the Xe that is flowing in gaseous state and the surface of the liquid diluent gas.

EXPLANATION OF REFERENCE NUMERALS

1 Polarized Xenon Gas Manufacturing Supply Device
1a,1b Supply Sources of Gases
6 Polarization Cell
61 Polarized Gas Transfer Pump
7 Excitation Light Source
9 Condenser
91 Reservoir tank
92 Heat Exchanger
93 Diluent Gas Transfer Pump
94 Heat Exchanger
10 Solidification and Separation Unit

The invention claimed is:

1. A method for concentrating a polarized xenon gas comprising:
   polarizing a xenon gas by exposing a mixture comprising the xenon gas and a diluent gas having at least one of a quenching effect and a buffering effect to light and an alkali metal gas; and
   separating the diluent gas from the mixture comprising the polarized xenon gas;
   wherein the diluent gas comprises, as a main component, a high-boiling-point gas having either a quenching effect or a buffering effect and having a boiling point higher than the xenon gas;

TABLE 7

Example F (Butane mixed gas, a 90-W laser, and a 30-cm cell were used)

|  | Xe flow rate cc/min | N$_2$ flow rate cc/min | Isobutene flow rate cc/min | Butane flow rate cc/min | Total flow rate cc/min | Xe content % | Cell pressure P atm | SNR (a.u.) | Polarization rate P % | SNR (after trapping) |
|---|---|---|---|---|---|---|---|---|---|---|
| Ex. 6 | 17 | 8.6 |  | 60 | 85.6 | 0.20 | 1.02 | 819.0 | 11.8 | 1639 |
|  | 17 | 8.6 |  | 40 | 65.6 | 0.26 | 0.78 | 858.7 | 9.8 | 1481 |
|  | 17 | 8.6 |  | 20 | 45.6 | 0.37 | 0.54 | 984.1 | 7.9 | 1307 |
| Ex. 7 | 17 |  | 8.6 | 60 | 85.6 | 0.20 | 1.02 | 450.5 | 6.4 | 1069 |
|  | 17 |  | 8.6 | 40 | 65.6 | 0.26 | 0.78 | 680.1 | 7.7 | 1213 |
|  | 17 |  | 8.6 | 20 | 45.6 | 0.37 | 0.54 | 812.6 | 6.3 | 1773 | and wherein the high-boiling-point gas is separated by condensation using a difference in boiling points between the xenon gas and the high-boiling-point gas.

2. The method for concentrating a polarized xenon gas according to claim 1, wherein the condensation of the high-boiling-point gas is conducted under a reduced pressure.

3. The method for concentrating a polarized xenon gas according to claim 1, wherein the condensation of the high-boiling-point gas is conducted in a magnetic field.

4. The method for concentrating a polarized xenon gas according to claim 1, wherein the high-boiling-point gas is an unsaturated hydrocarbon or an ether compound that comprises at least one multiple bond.

5. The method for concentrating a polarized xenon gas according to claim 1, wherein the high-boiling-point gas is isobutene gas.

6. The method for concentrating a polarized xenon gas according to claim 1, wherein the high-boiling-point gas comprises at least one member selected from the group consisting of propene, 2-methyl-2-butene, and furan.

7. The method for concentrating a polarized xenon gas according to claim 1, wherein the high-boiling-point gas is separated by condensation and solidification.

8. A polarized xenon gas manufacturing supply device comprising:
a polarization cell capable of producing a polarized xenon gas by polarizing a xenon gas by exposing a mixture of the xenon gas and a diluent gas having at least one of a quenching effect and a buffering effect to light and an alkali metal gas,
wherein the diluent gas comprises, as a main component, a high-boiling-point gas having either a quenching effect or a buffering effect and having a boiling point higher than that of xenon gas; and
a condenser capable of cooling the mixture of the xenon gas and the diluent gas discharged from the polarization cell and separating the high-boiling-point gas by condensation using a difference in boiling points between the xenon gas and the high-boiling-point gas;
wherein the polarized xenon gas manufacturing supply device is configured so that a condensed liquid of the high-boiling-point gas produced in the condenser can be re-vaporized and introduced back into the polarization cell.

9. The polarized xenon gas manufacturing supply device according to claim 8, wherein a vacuum pump for evacuating the polarized xenon gas is operably connected to the condenser;
and wherein the vacuum pump is configured to be capable of simultaneously reducing a pressure in the polarization cell and the condenser.

10. An MRI system comprising a polarized xenon gas manufacturing supply device; the MRI system being capable of conducting an MRI measurement using polarized xenon gas produced by the polarized xenon gas manufacturing supply device,
wherein the polarized xenon gas manufacturing supply device comprises:
a polarization cell capable of producing a polarized xenon gas by polarizing a xenon gas by exposing a mixture of the xenon gas and a diluent gas having at least one of a quenching effect and a buffering effect to light and an alkali metal gas,
wherein the diluent gas comprises, as a main component, a high-boiling-point gas having either a quenching effect or a buffering effect and having a boiling point higher than that of xenon gas; and
a condenser capable of cooling the mixture of the xenon gas and the diluent gas discharged from the polarization cell and separating the high-boiling-point gas by condensation using a difference in boiling points between the xenon gas and the high-boiling-point gas;
wherein the polarized xenon gas manufacturing supply device is configured so that a condensed liquid of the high-boiling-point gas produced in the condenser can be re-vaporized and introduced back into the polarization cell.

* * * * *